(12) United States Patent
Mellot

(10) Patent No.: US 6,842,525 B1
(45) Date of Patent: Jan. 11, 2005

(54) SIGNAL AMPLIFICATION CIRCUIT AND PROCESS FOR NEUTRALIZING NOISE FROM A POWER SUPPLY VOLTAGE

(75) Inventor: Pascal Mellot, Lans eu Vercors (FR)

(73) Assignee: STMicroelectronics SA, Gentilly (FR)

(*) Notice: Subject to any disclaimer, the term of this patent is extended or adjusted under 35 U.S.C. 154(b) by 0 days.

(21) Appl. No.: 09/491,953

(22) Filed: Jan. 26, 2000

(30) Foreign Application Priority Data

Jan. 28, 1999 (FR) .............................. 99 00946

(51) Int. Cl.[7] .............................................. H04R 3/00
(52) U.S. Cl. ..................... 381/92; 381/120; 381/111; 381/123; 330/267; 330/296; 330/273
(58) Field of Search ........................... 381/93, 91, 120, 381/113, 111, 104, 132; 330/267, 273, 296, 297

(56) References Cited

U.S. PATENT DOCUMENTS 5,543,759 A 8/1996 Comeau, II et al.
5,577,129 A 11/1996 Ehara

OTHER PUBLICATIONS

Hayt, Jr. "Engineering Circuit Analysis" Third Edition McGraw Hill 1978 p. 51.*

* cited by examiner

Primary Examiner—Michael B. Shingleton
(74) Attorney, Agent, or Firm—Lisa K. Jorgenson; Allen, Dyer, Doppelt, Milbrath & Gilchrist, P.A.

(57) ABSTRACT

An amplification circuit is provided for the signal output from a microphone in which the signal is amplified by a differential structure amplifier. The circuit includes the pull-up voltage, which initializes the operating state of the microphone, being coupled to a first input of the differential structure amplifier and to a second input of the differential structure amplifier through a pull-up resistor.

12 Claims, 2 Drawing Sheets

SIGNAL AMPLIFICATION CIRCUIT AND PROCESS FOR NEUTRALIZING NOISE FROM A POWER SUPPLY VOLTAGE

FIELD OF THE INVENTION

The present invention relates to the field of integrated circuits, and more particularly, to integrated circuits for amplification of a signal received from a electret microphone and to a process for neutralizing noise in a microphone power supply voltage.

BACKGROUND OF THE INVENTION

In many audio and video devices, an audio circuit includes an electret microphone and a low noise preamplifier into which a signal is input from a microphone. The preamplifier output signal may then be converted into a digital signal in an analog-digital converter and then amplified, processed, filtered and possibly memorized or stored in this form.

Electret microphones must be polarized by a positive DC voltage through a pull-up resistor initializing the microphone operating state. The microphone output signal, formed by a variable current, passes through this pull-up resistor so that the variable voltage at the terminals of this resistor is representative of the microphone output signal. One of the main problems with this type of audio circuit is the lack of immunity of the useful microphone output signal to noise affecting the positive DC biasing voltage of the electret microphone.

One known method of correcting this problem is to filter the biasing voltage before applying it to the pull-up resistor. This filtering may be done for example using an R.C. circuit. This process is expensive because it requires the addition of an additional capacitor external to the integrated circuit, and also it is not very efficient, particularly at the low frequencies present in the audio range.

SUMMARY OF THE INVENTION

An object of this invention is to neutralize noise in the biasing voltage of the electret microphone.

Any noise on the microphone biasing voltage is perceived as being a signal by the pull-up resistor initializing the position of the microphone, due to the way in which the microphone is connected and the fact that it is equivalent to a current source. Therefore, such noise is amplified by the low noise preamplifier (LNA). Although a differential structure is usually used for this preamplifier, it amplifies the noise in the biasing voltage.

An approach of the present invention is to correlate the microphone initialization voltage with the internal reference of the low noise amplifier or preamplifier. Consequently, the noise in this voltage is perceived as being a common mode noise on the preamplifier inputs and not a difference signal. In this way the noise is rejected, by difference, by the differential structure instead of being amplified.

Thus, the invention relates to a signal amplification circuit comprising an amplifier with a differential structure comprising two inputs. A first input receives a reference voltage and a second input receives the signal to be amplified. The two inputs are connected to each other through a biasing resistor. The first input is also coupled to the second input through a signal resistor through which a current passes, the variations of which are representative of the signal to be amplified.

The invention also relates to a process for neutralizing noise in an electret microphone power supply voltage. A microphone output signal is represented by the variations in a current passing through a pull-up resistor initializing the microphone operating position. The power supply voltage is input to this pull-up resistor. The process includes coupling a first terminal of the pull-up resistor firstly to the microphone output and secondly to a second input of an amplifier with a differential structure. The process further includes coupling a second terminal of the pull-up resistor to a first input to the amplifier with a differential structure.

BRIEF DESCRIPTION OF THE DRAWINGS

The invention and its advantage compared with prior art will be better understood after reading the following description with regard to the attached drawings in which.

DETAILED DESCRIPTION OF THE PREFERRED EMBODIMENTS

Figure 1:
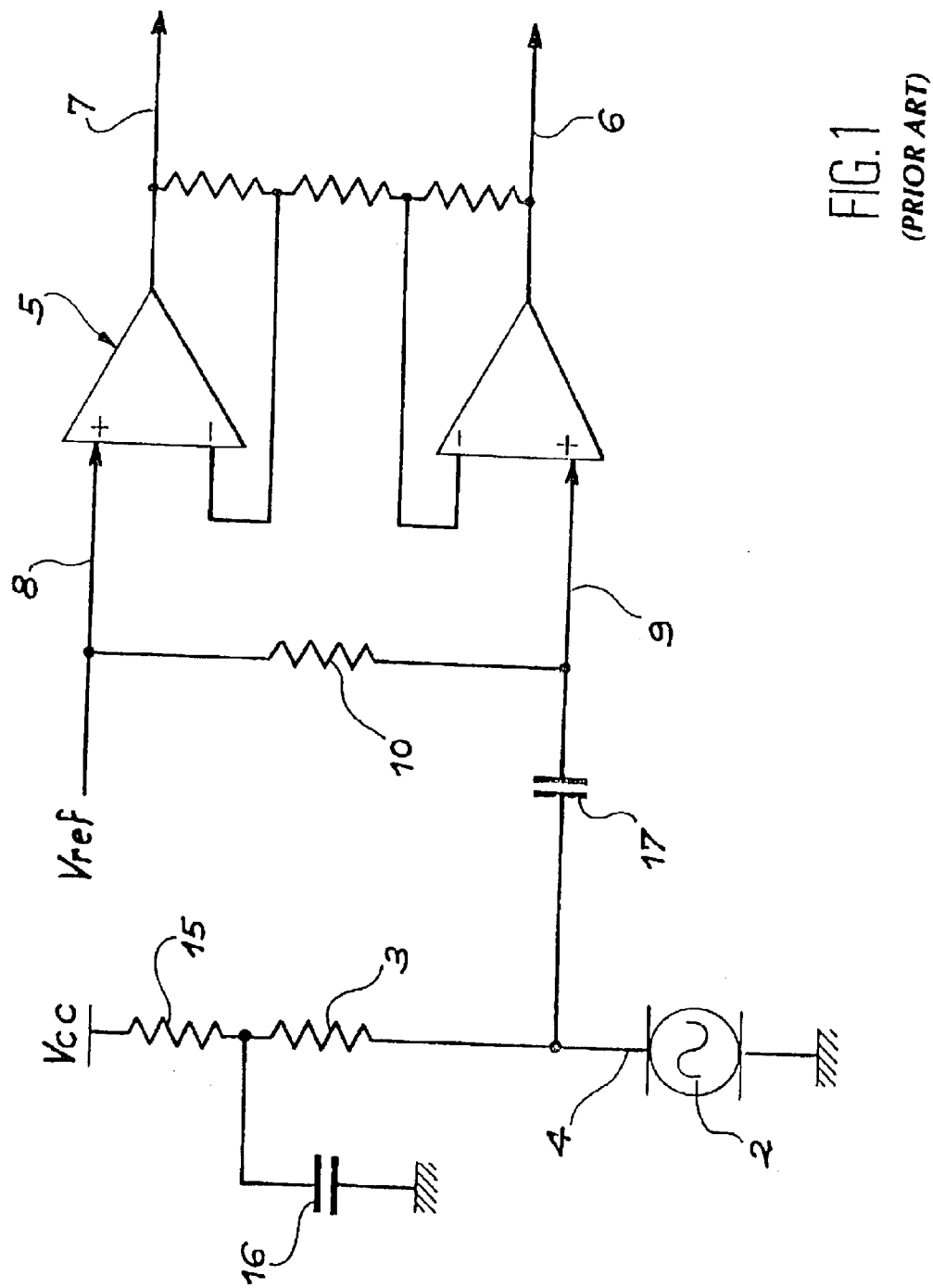
FIG. 1 is a functional diagram of a prior art circuit.

FIG. 1 shows a conventional circuit used for amplification of the output signal from a microphone 2. This signal is composed of a current produced by the microphone and developed in a pull-up and signal resistor 3, one connection of the resistor being connected to a microphone output 4. The other connection of resistor 3 is connected to a DC pull-up voltage VCC acting on the operating state of the microphone 2. This DC voltage is applied through a filter circuit composed of a resistor 15 and a capacitor 16. The output signal from the microphone 4 is connected to an input 9 to a differential structure amplifier 5. This amplifier has two inputs, a first 8 and a second 9, and two outputs, a first 6 and a second 7 known as the positive and negative outputs. A reference voltage is applied to the first input 8, and the signal to be amplified is applied to the second input 9, this signal being taken from the output 4 of microphone 2 through a filter capacitor 17. The two inputs 8 and 9 are connected to each other through a biasing resistor 10. In this type of system, it can be seen that any unfiltered noise from the pull-up DC voltage VCC is entirely transmitted to the pull-up resistor 3 and is therefore amplified by circuit 5.

Figure 2:
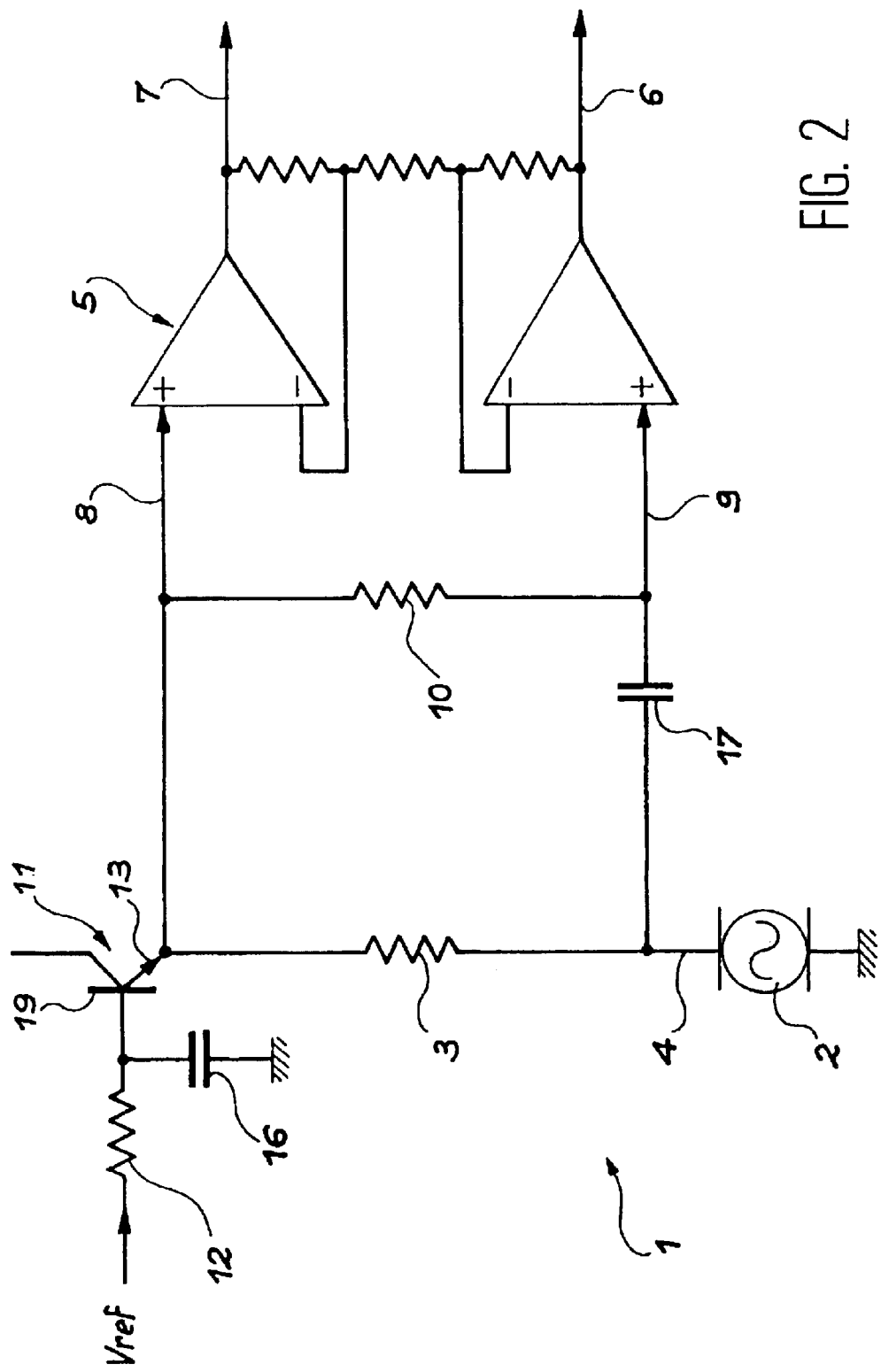
FIG. 2 is a diagram of a circuit of an embodiment of the present invention.

FIG. 2 shows a circuit 1 according to one embodiment of this invention. In this circuit, elements with the same function as the elements shown in FIG. 1 are represented with the same reference number. The circuit shown in FIG. 2 is different from the circuit shown in FIG. 1 because a reference voltage VREF is applied firstly to the first input 8 of the differential structure amplifier 5, and secondly to the pull-up and signal resistor 3 initializing the operating state of the microphone 2.

In the circuit shown in FIG. 2, this reference voltage is applied through an impedance matching circuit 11 comprising an input 12 and an output 13. The output 13 from this circuit 11 is applied firstly to the first input 8 of the amplification circuit 5, and secondly to a connection of the pull-up resistor 3. In the example shown in FIG. 2, the impedance matching circuit 11 is provided with an NPN transistor, the base 19 of which forms the input to the circuit and the emitter 13 of which forms the output. All elements shown in FIG. 2 are integrated on a chip except for the microphone 2 and the filter capacitor 17, the microphone 2 being connected through the connection 4 on the integrated circuit shown in FIG. 2.

That which is claimed is:

1. A signal amplification circuit comprising:
   a differential amplifier having a first input for receiving a reference voltage and second input for receiving a signal to be amplified;
   a biasing resistor connected between the first and second inputs; and
   a signal resistor, through which a current passes, connected between the first and second inputs and to an output of a microphone and the reference voltage, the variations of the current corresponding to the signal to be amplified, wherein the signal resistor comprises a pull-up resistor for initializing an operating state of a microphone, and wherein the second input of the differential amplifier is for connection to a microphone output.

2. A circuit according to claim 1, further comprising an impedance matching stage having an input for receiving the reference voltage and an output connected to the first input of the differential amplifier.

3. An amplifier circuit comprising:
   a differential amplifier having a first input for receiving a reference voltage and second input for receiving a signal to be amplified;
   a biasing resistor connected between the first and second inputs; and
   a signal resistor connected between the first and second inputs and in parallel to the biasing resistor and connected to an output of a microphone and the reference voltage, wherein the signal resistor comprises a pull-up resistor for initializing an operating state of a microphone, and wherein the second input of the differential amplifier is for connection to a microphone output.

4. An amplifier circuit according to claim 3, wherein the variations of a current passing through the signal resistor correspond to the signal to be amplified.

5. An amplifier circuit according to claim 3, further comprising an impedance matching stage having an input for receiving the reference voltage and an output connected to the first input of the differential amplifier.

6. A microphone comprising:
   a signal output; and
   an output signal amplifying circuit for amplifying a microphone output signal from the signal output and comprising
      a differential amplifier having a first input for receiving a reference voltage and second input connected to the signal output,
      a biasing resistor connected between the first and second inputs, and
      a signal resistor connected between the first and second inputs and in parallel to the biasing resistor and connected to the output of the microphone and reference voltage, wherein the signal resistor comprises a pull-up resistor for initializing an operating state of the microphone.

7. A microphone according to claim 6, wherein the variations of a current passing through the signal resistor correspond to the microphone output signal.

8. A microphone according to claim 6, wherein output signal amplifying circuit further comprises an impedance matching stage having an input for receiving the reference voltage and an output connected to the first input of the differential amplifier.

9. A method of amplifying an output signal from an electret microphone, the output signal being represented by variations in a current passing through a pull-up resistor for initializing the operating state of the microphone, the method comprising the steps of:
   connecting a first terminal of the pull-up resistor to an output of the microphone;
   connecting a second terminal of the pull-up resistor to a first input of a differential amplifier; and
   connecting the first terminal of the pull-up resistor to a second input of the differential amplifier.

10. A method of making an amplifier circuit comprising the steps of:
    providing a differential amplifier having a first input for receiving a reference voltage and second input for receiving a signal to be amplified;
    connecting a biasing resistor between the first and second inputs; and
    connecting a signal resistor between the first and second inputs and in parallel to the biasing resistor and to an output of a microphone and the reference voltage, wherein the signal resistor comprises a pull-up resistor for initializing an operating state of a microphone, and wherein the second input of the differential amplifier is for connection to a microphone output.

11. A method according to claim 10, wherein the variations of a current passing through the signal resistor correspond to the signal to be amplified.

12. A method according to claim 10, further comprising the step of connecting an output of an impedance matching stage to the first input of the differential amplifier, the impedance matching stage having an input for receiving the reference voltage.

* * * * *